(12) United States Patent
Cho et al.

(10) Patent No.: US 8,999,532 B2
(45) Date of Patent: Apr. 7, 2015

(54) COATING LAYER FOR CUTTING TOOLS

(75) Inventors: Seong Woo Cho, Cheongju-si (KR); Han Sung Kim, Cheongju-si (KR); Dong Youl Lee, Cheongju-si (KR); Dae Suk Han, Cheongju-si (KR); Young Ho Seo, Cheongju-si (KR); Seoun Young Ahn, Cheongju-si (KR); Dong Bok Park, Cheongju-si (KR)

(73) Assignee: Korloy Inc., Seoul (KR)

( * ) Notice: Subject to any disclaimer, the term of this patent is extended or adjusted under 35 U.S.C. 154(b) by 90 days.

(21) Appl. No.: 13/695,886

(22) PCT Filed: Jul. 8, 2011

(86) PCT No.: PCT/KR2011/005014
§ 371 (c)(1),
(2), (4) Date: Nov. 2, 2012

(87) PCT Pub. No.: WO2012/165696
PCT Pub. Date: Dec. 6, 2012

(65) Prior Publication Data
US 2013/0149527 A1    Jun. 13, 2013

(30) Foreign Application Priority Data
Jun. 3, 2011 (KR) .................. 10-2011-0053757

(51) Int. Cl.
*C23C 14/06* (2006.01)
*B26D 7/00* (2006.01)
*C23C 16/34* (2006.01)
(Continued)

(52) U.S. Cl.
CPC .............. *B26D 7/00* (2013.01); *Y10T 428/265* (2015.01); *C23C 16/34* (2013.01); *C23C 16/403* (2013.01); *C23C 30/005* (2013.01); *C23C 28/042* (2013.01); *C23C 28/044* (2013.01)

(58) Field of Classification Search
CPC .......... B23B 27/14; B26D 7/00; C23C 16/12; C23C 16/34; C23C 16/403; C23C 16/44; C23C 28/00; C23C 28/042; C23C 28/044; C23C 30/005
USPC .................. 428/336, 697, 698, 699, 701, 702
See application file for complete search history.

(56) References Cited

U.S. PATENT DOCUMENTS 5,955,390 A    9/1999  Mehrotra et al.
6,726,987 B2 *  4/2004  Kathrein et al. .............. 428/701
(Continued)

FOREIGN PATENT DOCUMENTS

JP    2003-071611    *  3/2003
JP    4173762 B2       11/2004
(Continued)

*Primary Examiner* — Archene Turner
(74) *Attorney, Agent, or Firm* — Sherr & Jiang, PLLC

(57) ABSTRACT

Provided is a coating layer for cutting tools, as a hard coating layer stacked and formed in the sequence of a TiN layer, a TiCN layer, a bonding layer, an alumina ($Al_2O_3$) layer, and a cover layer from the bottom by using a chemical vapor deposition (CVD) method on a parent material, able to improve cutting performance, because surface residual stress of the coating layer may be maintained in a compressive stress state by adjusting a composition of the cover layer without using a separate additional process, such as a blasting operation, or a mixed process of CVD and physical vapor deposition (PVD), and simultaneously the cover layer may also be used as a wear-resistant layer.

4 Claims, 7 Drawing Sheets

(51) Int. Cl.
    *C23C 16/40*     (2006.01)
    *C23C 30/00*     (2006.01)
    *C23C 28/04*     (2006.01)

(56) References Cited

U.S. PATENT DOCUMENTS

| | | | |
|---|---|---|---|
| 6,824,601 B2 * | 11/2004 | Yamamoto et al. | 428/699 |
| 6,919,288 B2 | 7/2005 | Yamamoto et al. | |
| 7,763,366 B2 | 7/2010 | Yamamoto et al. | |
| 7,776,393 B2 | 8/2010 | Tamagaki et al. | |
| 8,007,929 B2 * | 8/2011 | Itoh et al. | 428/701 |
| 8,133,576 B2 * | 3/2012 | Omori et al. | 428/698 |
| 2006/0219325 A1 | 10/2006 | Kohara | |

FOREIGN PATENT DOCUMENTS

| | | |
|---|---|---|
| JP | 2006-307318 A | 11/2006 |
| JP | 2007-204820 A | 8/2007 |
| JP | 2008-126334 A | 6/2008 |
| KR | 10-284058 B1 | 12/2000 |
| KR | 10-2005-0083037 A | 8/2005 |
| KR | 10-2010-0135641 A | 12/2010 |
| WO | WO 97/18177 | 5/1997 |

* cited by examiner

COATING LAYER FOR CUTTING TOOLS

CROSS REFERENCE TO PRIOR APPLICATIONS

This application is a National Stage Patent Application of PCT International Patent Application No. PCT/KR2011/005014 (filed on Jul. 8, 2011) under 35 U.S.C. §371, which claims priority to Korean Patent Application No. 10-2011-0053757 (filed on Jun. 3, 2011), which are all hereby incorporated by reference in their entirety.

TECHNICAL FIELD

The present invention relates to a hard coating layer formed on a cemented carbide parent material, and more particularly, to a hard coating layer, as a hard coating layer stacked and formed in the sequence of a TiN layer, a TiCN layer, a bonding layer, an alumina ($Al_2O_3$) layer, and a cover layer from the bottom by using a chemical vapor deposition (CVD) method on the parent material, able to improve cutting performance, because surface residual stress of the coating layer may be maintained in a compressive stress state through the cover layer having a composition different from that of a TiN/TiCN layer widely used as a typical cover layer without using a separate additional process, such as a blasting operation, and or a mixed process of CVD and physical vapor deposition (PVD), and simultaneously the cover layer may also be used as a wear-resistant layer.

BACKGROUND ART

A TiCN thin film, which has been widely used as a hard coating layer for cemented carbide cutting tools, is formed through a reaction at a high temperature of about 1000° C. by using reaction gases such as $TiCl_4$, $CH_4$, and $N_2$. During this process, carbon (C) is diffused from a cemented carbide parent material into the TiCN thin film to form a very hard and brittle phase, such as $Co_3W_3C$ or $Co_6W_6C$, at an interface between the parent material and the TiCN thin film, and thus, toughness of a cutting tool may decrease.

In order to address the foregoing limitation, a method of forming a TiCN thin film by using a moderate temperature chemical vapor deposition (hereinafter, referred to as "MTCVD") is suggested. This method uses $TiCl_4$ and $CH_3CN$ as a source of carbon and nitrogen (N) during the formation of TiCN to decrease a deposition temperature to a range of about 750° C. to 850° C., and thus, generation of the very hard and brittle phase, such as $Co_3W_3C$ or $Co_6W_6C$, is controlled by inhibiting diffusion of carbon from the cemented carbide parent material to TiCN during the formation of the TiCN thin film. Thus, the method is characterized by that the TiCN thin film formed after coating has high toughness as well as wear resistance.

The foregoing MTCVD TiCN thin film is commercialized in a multilayered structure, in which a bonding layer is formed on the MTCVD TiCN thin film and then oxide, such as an alumina layer, is formed thereon, and recently, used widely in cutting tools for turning and milling.

Heat as well as wear of a thin film is generated due to the friction between a cutting tool (insert) and a workpiece during machining, and in a multilayered thin film having a stack structure in the sequence of a MTCVD TiCN layer, a bonding layer, an alumina layer ($Al_2O_3$) from a parent material, a cover layer is additionally formed on the alumina layer, an uppermost layer, in order to identify the usage of a cutting tool or distinguish from products of other makers.

However, with respect to a stress state of the foregoing typical chemical vapor deposition (CVD) coating layer for cutting tools, since surface residual stress is maintained in a tensile stress state up to the alumina layer as shown in FIG. 1, the wear-resistant coating layer may be easily damaged due to the effect of residual stress, and thus, lifetime of the coating layer may be decreased during machining.

In relation to the foregoing, methods have been typically attempted, in which compressive residual stress is applied to a surface of a coating layer by using a separate process, such as a blasting treatment, or a compressive residual stress state is generated by coating a cover layer by using a physical vapor deposition (PVD) method after forming an alumina layer or the like by using a CVD method.

However, a separate process may be added due to the blasting process, and a process of mixed use of the CVD and PVD method may not only be inconvenience but adhesion between the CVD layer and the PVD layer may also be poor, and thus, physical properties of the coating layer may deteriorate.

DISCLOSURE OF THE INVENTION

Technical Problem

The purpose of the present invention is to provide a coating layer for cutting tools able to extend the lifetime of a tool, because entire coating may be possible by only using a chemical vapor deposition (CVD) method, surface residual stress of the coating layer may be maintained in a compressive stress state after the coating by using the CVD method, and a cover layer may also be partially used for wear resistance purpose.

Technical Solution

Accordingly, the present invention provides a coating layer for cutting tools formed on a surface of a parent material by using a chemical vapor deposition (CVD) method including: an alumina layer formed of an α-phase, disposed on the parent material and composed of a composite structure having a columnar crystal structure and an equiaxed crystal structure mixed therein; and a cover layer formed of $Al_xTi_ySi_zCr_wN$ (herein, $x+y+z+w=1$, $x \geq 0.75$, $y \geq 0.2$, $0 \leq z \leq 0.06$, $0 \leq w \leq 0.08$) and disposed on the alumina layer.

In the coating layer for cutting tools according to the present invention, w, for example, may be in a range of 0.01 to 0.06 in order to increase distinctiveness of the cover layer.

Also, in the coating layer for cutting tools according to the present invention, a bonding layer formed of $TiC_xO_yN_z$ ($x+y+z=1$, $x,y,z>0$, $0.4 \leq x \leq 0.5$, $0.3 \leq y \leq 0.4$, $0.15 \leq z \leq 0.25$) may be formed under the alumina layer by using a CVD method and the bonding layer may be composed of a similar dendritic structure having a primary acicular structure grown in a thickness direction and a secondary acicular structure grown in an acicular shape on a surface of the primary acicular structure.

Also, in the coating layer for cutting tools according to the present invention, among a texture coefficient (TC) of each crystal plane of the alumina layer calculated by the following Equation 1, TC(024) may be 2.0 or more, TC(116) may be less than 1.8, and TC(012), TC(104), TC(110), and TC(113) may be all less than 1.3, $$TC(hkl) = I(hkl)/I_0(hkl) \times \{(1/n) \times \Sigma I(hkl)/I_0(hkl)\}^{-1}$$

I(hkl): diffraction intensity of a crystal plane
$I_0$(hkl): standard diffraction intensity of ASTM standard powder diffraction data
n: the number of crystal planes used for calculation
(hkl): (012), (104), (110), (113), (024), (116).

Also, in the coating layer for cutting tools according to the present invention, an upper portion of the alumina layer may be doped with boron (B) at a content of 0.05 wt % or less.

Also, in the coating layer for cutting tools according to the present invention, a thickness of the cover layer may be in a range of 1.5 μm to 3.5 μm.

Advantageous Effects

With respect to a coating layer for cutting tools according to the present invention, since surface residual stress of the coating layer becomes a compressive stress state after coating by using a chemical vapor deposition (CVD) method, a typical blasting treatment or mixed use of a physical vapor deposition (PVD) method may not be required, and thus, the lifetime of the tools may be extended by a simplified process.

Also, since a cover layer according to the present invention not only provides distinctiveness from products of other makers but also include 75 at % or more of aluminum, aluminum may form aluminum oxide by being combined with oxygen in the air during machining, and thus, an additional improvement of cutting performance may be expected because the cover layer may also partially act as a wear-resistant layer.

MODE FOR CARRYING OUT THE INVENTION

Figure 1:
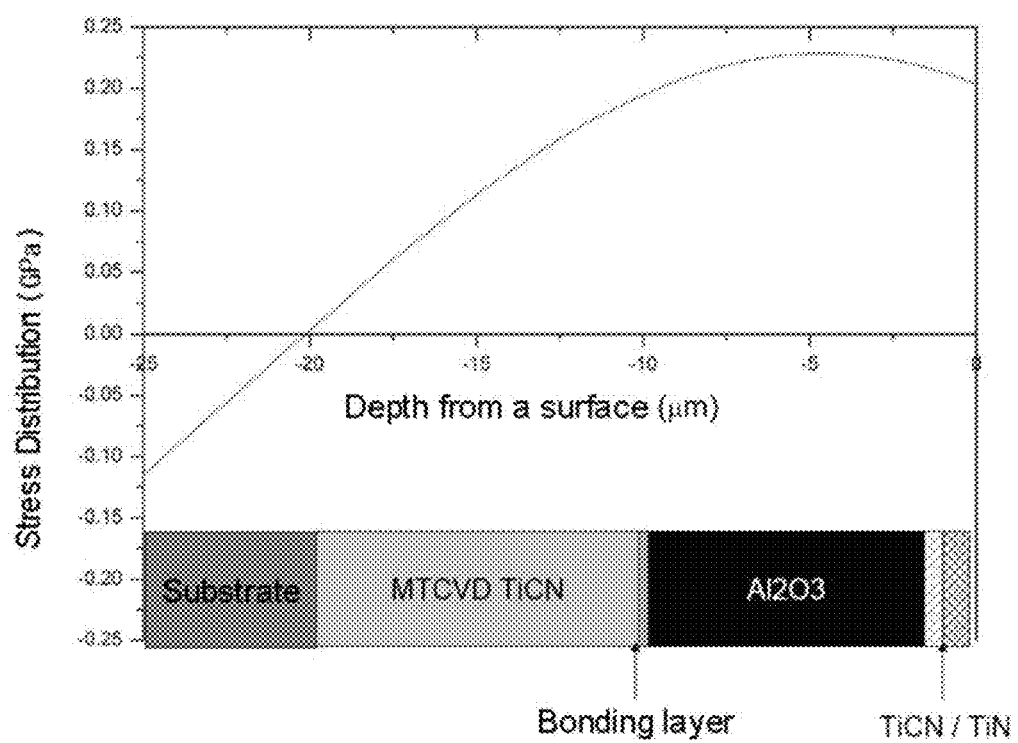
FIG. 1 illustrates a stress state of a coating layer formed by using a typical chemical vapor deposition (CVD) method according to a thickness thereof.

Hereinafter, the present invention will be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

A coating layer for cutting tools according to the present invention is formed on a surface of a parent material by using a chemical vapor deposition (CVD) method and includes an alumina layer formed of an α-phase, disposed on the parent material and composed of a composite structure having a columnar crystal structure and an equiaxed crystal structure mixed therein, and a cover layer formed of $Al_xTi_ySi_zCr_wN$ (herein, x+y+z+w=1, x≥0.75, y≥0.2, 0≤z≤0.06, 0≤w≤0.08) and disposed on the alumina layer.

The coating layer for cutting tools according to the present invention has the following difference in comparison to a typical CVD alumina coating layer.

First, the coating layer according to the present invention is characterized by that an $Al_xTi_ySi_zCr_wN$ layer containing a large amount of aluminum (Al) is formed as a cover layer instead of a typical TiN/TiCN layer.

It may be difficult to allow the $Al_xTi_ySi_zCr_wN$ layer to contain an Al content of 0.65 or more without phase separation when a physical vapor deposition (PVD) method is used. However, when a low pressure chemical vapor deposition (LPCVD) method is used, a high Al content of 0.75 or more may be contained. When the $Al_xTi_ySi_zCr_wN$ layer is used as a cover layer according to the present invention, surface residual stress of the coating layer may be made in a compressive state without using a typical blasting process or process of mixed use of CVD and PVD. Therefore, lifetime of a cutting tool may be improved in comparison to that having a coating layer in a tensile state. Also, Al included in the $Al_xTi_ySi_zCr_wN$ layer is oxidized during machining to act similarly to alumina and thus, the lifetime of the cutting tool may be further extended because the $Al_xTi_ySi_zCr_wN$ layer may partially contribute as a wear-resistant layer in addition to simple ornamental or distinctive function. When the content of Al is less than 0.75, sufficient compressive residual stress and an improvement in oxidation resistance may not be expected. Therefore, the content of Al may be controlled to be 0.75 or more.

Meanwhile, when the $Al_xTi_ySi_zCr_wN$ layer containing a large amount of Al is exposed to a high temperature for a prolonged period of time during machining, phase separation from a face centered cubic (fcc) crystal structure to an Al or titanium (Ti) component may occur and the phase separation results in a decrease in high-temperature hardness, and thus, cutting performance may be degraded. However, in the present invention, the decrease in high-temperature hardness may be prevented through addition of silicon (Si) and chromium (Cr) and simultaneously, a unique color may be provided to the cover layer, and thus, the cover layer may also be used for an ornamental or distinctive application.

Si is added to a TiAlN-based thin film to form a plurality of interfaces by phase separation into nanoscale $Si_3N_4$ in the TiAlN-based thin film and is a component for improving room-temperature hardness and high-temperature hardness through a strengthening effect due to the interfaces. When a content of Si added is greater than 0.06, physical properties deteriorate due to the formation of a large amount of Si single phase or amorphous $Si_3N_4$. Therefore, the content of Si added may be 0.06 or less. A predetermined effect may be expected even in the case that a small amount of Si is added. However, the content of Si added, for example, may be 0.01 or more in order to sufficiently obtain the foregoing high-temperature strengthening effect.

Cr is a component for improving high-temperature hardness due to a solid solution strengthening effect and simultaneously providing a unique color (bright gray color) by being added to the TiAlN-based thin film such as Si. When Cr is added in an amount of less than 0.01, the effect thereof may be insignificant, and when Cr is added in an amount of greater than 0.07, Cr may not be in a state of being dissolved in a lattice. Therefore, preferably Cr may be added in an amount of 0.07 or less and more preferably Cr may be added in an amount range of 0.01 to 0.06.

Second, the coating layer according to the present invention is characterized by that a microstructure of an α-alumina layer is composed of a composite structure having a columnar crystal structure and an equiaxed crystal structure mixed therein, different from a typical single columnar crystal structure.

The α-alumina layer composed of the foregoing composite structure may provide an effect of further extending the lifetime of a tool in comparison to that composed of a typical single columnar crystal structure during interrupted machining generating an impact. Also, an upper portion of the α-alumina thin film is partially doped with boron (B) in a $BCl_3$ form during the formation of the α-alumina thin film. The reason for this is that the boron doping on the upper portion during the formation of alumina acts to transform a crystal structure of the alumina into a mixed structure of a lower columnar crystal structure and an upper equiaxed crystal structure. A surface of the α-alumina ($Al_2O_3$) formed by partial doping of B is changed from a faceted shape of columnar crystal structure to a hexagonal plate shape and this affects cutting performance of the coating layer. Meanwhile, when a doping amount of boron is greater than 0.05 wt %, the cutting performance of the coating layer may be rather decreased due to the formation of a boron compound. Therefore, the doping amount of boron may be controlled to be 0.05 wt % or less.

Third, since the coating layer according to the present invention has a similar dentritic structure in which a microstructure of a bonding layer includes a plurality of protrusions protruding vertically and horizontally, the α-$Al_2O_3$ layer formed on the bonding layer may have a physically strong bonding force with respect to the bonding layer, and thus, performance degradation of the cutting tool due to a decrease in the bonding force may be prevented. Meanwhile, when a compositional range of the bonding layer is not within a range limited in the present invention, formation of the similar dentritic structure is not facilitated, and thus, the foregoing range may be maintained.

The hard coating layer according to the embodiment of the present invention may be used for a parent material formed of cemented carbide, cermet, or ceramic, and in the embodiment of the present invention, a coating layer was formed in the sequence of a TiN layer, a MT-TiCN layer, a $TiC_xO_yN_z$ bonding layer, an alumina layer, and an $Al_xTi_ySi_zCr_wN$ layer by using an insert prepared from cemented carbide.

(1) TiN Layer

TiN was a layer disposed as an innermost layer on a cemented carbide parent material and was formed to a thickness of about 2.2 μm by introducing about 5.4 vol % of $TiCl_4$, 55.8 vol % of $H_2$, and 38.8 vol % of $N_2$ at a temperature within a range of 850° C. to 900° C. and maintaining at a pressure within a range of 150 mbar to 200 mbar.

(2) MT-TiCN Layer

A TiCN layer having a columnar crystal structure was formed on the TiN layer by using a moderate temperature chemical vapor deposition (MTCVD) method. The deposition temperature was maintained within a range of about 850° C. to 900° C., about 47 vol % of $H_2$, 40 vol % of $N_2$, 12 vol % of $TiCl_4$, and 1 vol % of $CH_3CN$ were introduced as reaction gases, and a thickness of the TiCN layer was formed within a range of about 7 μm to 8 μm while the deposition pressure was maintained in a range of 70 mbar to 90 mbar.

(3) Bonding Layer

Figure 2:
FIG. 2 is a scanning electron microscope (SEM) image showing a microstructure of a bonding layer in a coating layer according to the present invention.
Figure 3:
FIG. 3 is a SEM image showing a microstructure of an alumina layer in the coating layer according to the present invention.

A thin film having a composition of $TiC_xO_yN_z$ (x+y+z=1, x,y,z>0, 0.4≤x≤0.5, 0.3≤y≤0.4, 0.15≤z≤0.25) was formed as a bonding layer on the MT-TiCN layer. Deposition of the $TiC_xO_yN_z$ layer was performed by a condition in which reaction gases (75 vol % of $H_2$, 19 vol % of $N_2$, 3.0 vol % of $CH_4$, 2.0 vol % of CO, and 1.5 vol % of $TiCl_4$) were introduced at a deposition temperature of about 1000° C. and within a pressure range of 100 mbar to 150 mbar. As a result of analyzing a thin film formed according to the embodiment of the present invention by a transmission electron microscope (TEM), the thin film was composed of a similar dentritic microstructure having a double acicular structure, in which primary acicular crystals were formed and secondary acicular crystals were formed on surfaces of the primary acicular crystals, as shown in FIG. 2. As a result of analysis by energy dispersive X-ray spectroscopy (EDS) in the TEM, the composition of the thin film was $TiC_{0.43}N_{0.36}O_{0.21}$.

(4) Alumina Layer (024) planes of the alumina layer formed on the bonding layer preferentially grew to form an α-$Al_2O_3$ layer having a composite crystal structure of columnar crystals and equiaxed crystals. A deposition condition of the alumina layer was divided into two steps, in which, in a first step, about 78 vol % of $H_2$, 3.5 vol % of $CO_2$, 0.28 vol % of $H_2S$, and 3 vol % to 4 vol % of HCl were introduced within a temperature range of about 1000° C. to 1005° C. and a pressure range of 55 mbar to 75 mbar, and simultaneously, an $AlCl_3$ generating apparatus required for generation of $Al_2O_3$ was maintained at a reaction temperature of 335° C. and 10.4 vol % of $H_2$ and 5 vol % of HCl were introduced to form $Al_2O_3$ having a constant thickness, and then in a second step, 0.1 vol % to 0.25 vol % of $BCl_3$ was introduced during the same $Al_2O_3$ deposition process as that of the first step to transform the microstructure of the α-$Al_2O_3$ layer into a two-phase mixed structure having the equiaxed crystals formed on the upper portions of the columnar crystals. A preferred growth orientation of the α-$Al_2O_3$ layer formed through the foregoing process was analyzed by x-ray diffraction (XRD) and texture coefficients of crystal planes were calculated by using the following Equation 1. As a result, it was confirmed that the α-$Al_2O_3$ layer preferentially grew in a (024) orientation as listed in the following Table 1.

$$TC(hkl)=I(hkl)/I_0(hkl)\times\{(1/n)\times\Sigma I(hkl)/I_0(hkl)\}^{-1} \quad \text{[Equation 1]}$$

I(hkl): diffraction intensity of a crystal plane
$I_0$(hkl): standard diffraction intensity of ASTM standard powder diffraction data
n: the number of crystal planes used for calculation
(hkl): (012), (104), (110), (113), (024), (116)

TABLE 1

XRD analysis results of an alumina layer of the present invention

| (hkl) | (012) | (104) | (110) | (113) | (024) | (116) |
|---|---|---|---|---|---|---|
| TC | 1.123 | 0.278 | 0.496 | 0.611 | 2.338 | 1.154 |

That is, with respect to the alumina layer according to the present invention, TC(024) was 2.0 or more, TC(116) was less than 1.8, and TC(102), TC(104), TC(110), and TC(113) were all less than 1.3.

(5) AlTiSiCrN Layer

Six types of $Al_xTi_ySi_zCr_wN$ layers having compositions of the following Table 2 were formed on the alumina layer composed of the two-phase mixed structure by using a LPCVD method.

At this time, $H_2$, $NH_3$, $TiCl_4$, and $AlCl_3$ were used as reaction gases for forming AlTiN. Among these gases, $AlCl_3$ was prepared from a chemical reaction of $H_2$, HCl, and Al chips by using a separate generating apparatus and Si added to improve high-temperature hardness and oxidation resistance was added into the thin film through a method of vaporizing a $SiCl_4$ solution to be flown into a LPCVD reactor. Also, Cr selectively added to improve high-temperature hardness was added into the thin film through a method, in which $CrCl_4$ was formed through a chemical reaction of Cr chips, $H_2$, and HCl by using a separate generating apparatus while the temperature was maintained at about 700° C. and then flown into the LPCVD reactor. Deposition temperature during the formation of the thin film was within a range of 750° C. to 850° C. and deposition pressure was maintained within a range of 20 mbar to 150 mbar. Cover layers formed to a thickness of about 1.7 μm through the foregoing process are presented in Table 2 below.

TABLE 2

| Type | Cover layer composition | Coating conditions (800° C., 50 mbar) | Remarks |
|---|---|---|---|
| A165 | $Al_{0.64}Ti_{0.29}Si_{0.04}Cr_{0.03}N$ | $H_2$, $NH_3$, $AlCl_3/TiCl_4$ = 3.0, 2.0 ml/min $SiCl_4$, 1.0 l/min $CrCl_4$ | Comparative Example |
| A170 | $Al_{0.71}Ti_{0.22}Si_{0.04}Cr_{0.03}N$ | $H_2$, $NH_3$, $AlCl_3/TiCl_4$ = 3.4, 2.0 ml/min $SiCl_4$, 1.0 l/min $CrCl_4$ | Comparative Example |
| A175 | $Al_{0.74}Ti_{0.19}Si_{0.04}Cr_{0.03}N$ | $H_2$, $NH_3$, $AlCl_3/TiCl_4$ = 3.8, 2.0 ml/min $SiCl_4$, 1.0 l/min $CrCl_4$ | Example |
| A180 | $Al_{0.79}Ti_{0.14}Si_{0.04}Cr_{0.03}N$ | $H_2$, $NH_3$, $AlCl_3/TiCl_4$ = 4.2, 2.0 ml/min $SiCl_4$, 1.0 l/min $CrCl_4$ | Example |
| A185 | $Al_{0.84}Ti_{0.09}Si_{0.04}Cr_{0.03}N$ | $H_2$, $NH_3$, $AlCl_3/TiCl_4$ = 4.6, 2.0 ml/min $SiCl_4$, 1.0 l/min $CrCl_4$ | Example |
| A190 | $Al_{0.89}Ti_{0.06}Si_{0.03}Cr_{0.02}N$ | $H_2$, $NH_3$, $AlCl_3/TiCl_4$ = 5.0, 2.0 ml/min $SiCl_4$, 1.0 l/min $CrCl_4$ | Example |

Figure 4:
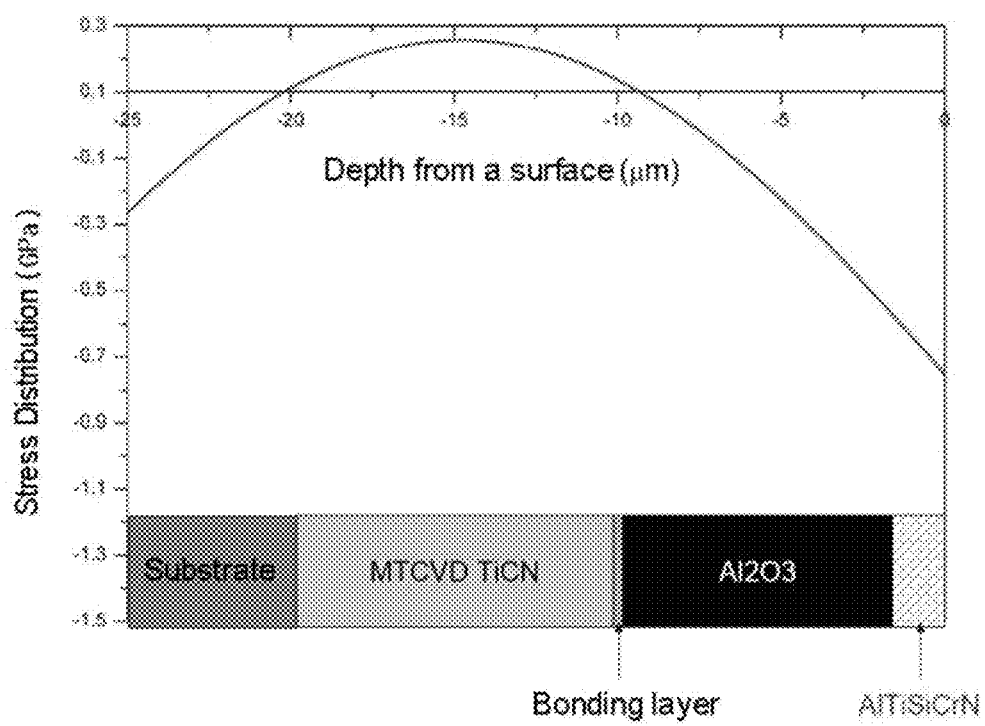
FIG. 4 is a graph showing a stress state of a coating layer formed according to an embodiment (A185) of the present invention according to a thickness thereof.

As a result of measuring residual stress of A185 among the prepared coating layers along a thickness direction, it was confirmed that the residual stress was in a compressive stress state up to about 10 μm from a surface, i.e., up to the alumina layer, as shown in FIG. 4.

Figure 5:
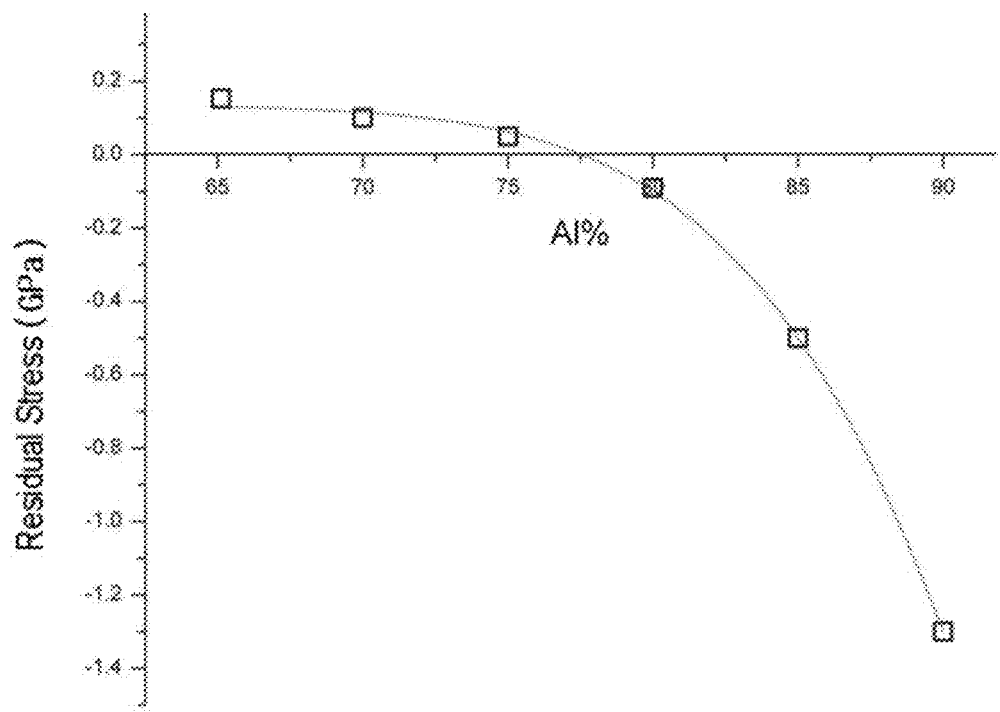
FIG. 5 is a graph showing the result of measurement of surface residual stress of coating layers according to an aluminum (Al) content of a cover layer.

Also, as a result of measuring surface residual stresses of all coating layers of Table 2, it may be understood that, as shown in FIG. 5, a tensile state was obtained when a content of Al was less than 0.75, a state of virtually no residual stress was maintained when the content of Al was 0.75, and a compressive state was obtained when the content of Al was greater than 0.8.

Further, in order to identify a difference in cutting performance according to a thickness of the cover layer according to the embodiment of the present invention, cover layers having a composition similar to the composition of A185 in Table 2 were formed to thicknesses as listed in Table 3.

TABLE 3

| Type | Cover layer composition | Thin film thickness (μm) | Remarks |
|---|---|---|---|
| 1 | A175 ($Al_{0.74}Ti_{0.19}Si_{0.04}Cr_{0.03}N$) | 1.0 | Comparative Example |
| 2 | | 1.5 | Comparative Example |
| 3 | | 2.0 | Example |
| 4 | | 2.5 | Example |
| 5 | | 3.0 | Example |
| 6 | | 3.5 | Example |

In order to evaluate cutting performance of the coating layers thus prepared, machining generating thermochemical wear and wear due to oxidation was performed under the following conditions.
workpiece: SCM 440 cylinder (diameter 300 mm×length 600 mm, including four grooves)
cutting speed (Vc): 230 m/min
feed rate (fn): 0.3 mm/rev
depth of cut (ap): 1.5 mm
machining method: wet machining
machining time: 30 minutes for each sample type Damage ratios of cutting tools were measured through the foregoing machining conditions and the damage ratio was measured in such a manner that when twenty samples having the same type were prepared and machining was performed on each sample for 30 minutes, edge damage frequency of the each sample was identified. When there was no chipping and damage on edges after machining for 30 minutes, the sample was evaluated as "normal", and when there was chipping and damage on the edges after machining for 30 minutes, the sample was evaluated as "damaged". In particular, the damage ratio was calculated by the following Equation 2. The same evaluation was performed on the entire six types of A165 to A190 samples.

Damage ratio(%)=(number of damaged samples/total number of samples)×100 [Equation 2]

Figure 6:
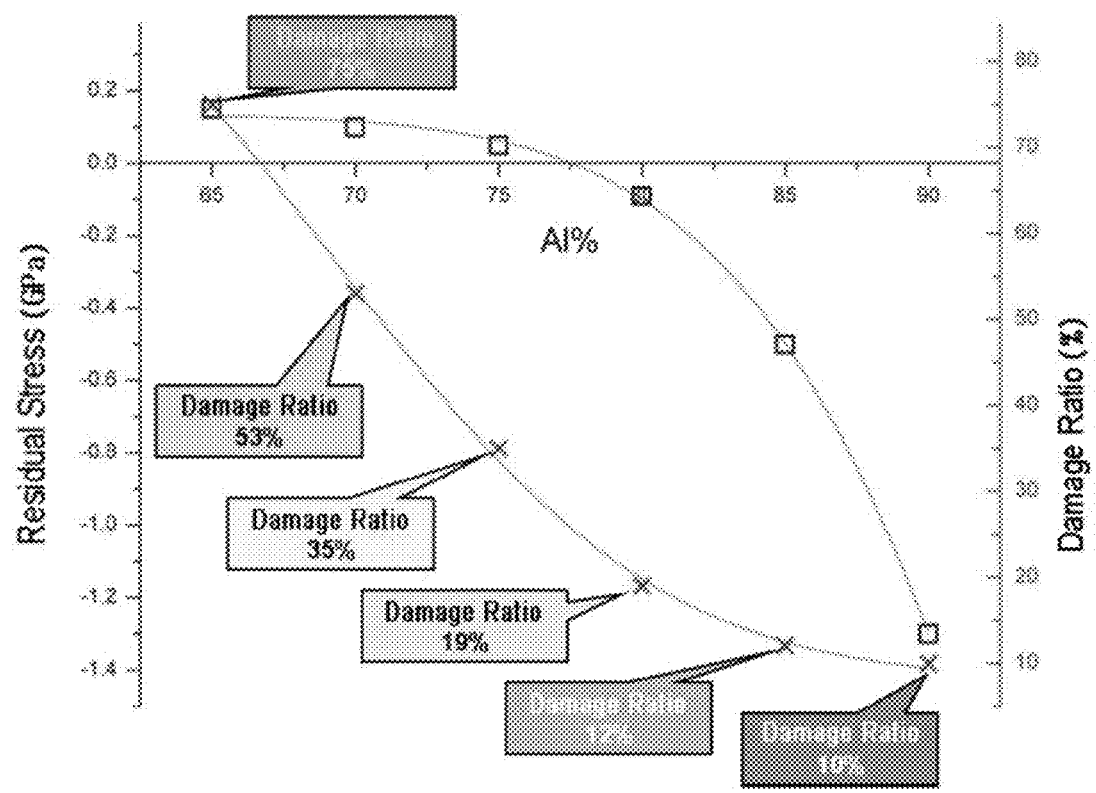
FIG. 6 is a graph showing changes in a damage ratio of the coating layers according to the Al content of the cover layer.

FIG. 6 is a graph showing changes in a damage ratio of the coating layers according to the Al content of the cover layer. As shown in FIG. 6, it may be understood that the compressive state of surface residual stress was strengthened as the content of Al in the cover layer increased and as a result, the damage ratio was also rapidly decreased. It may be understood that a good damage ratio was obtained when the content of Al was 75 at % or more.

Figure 7:
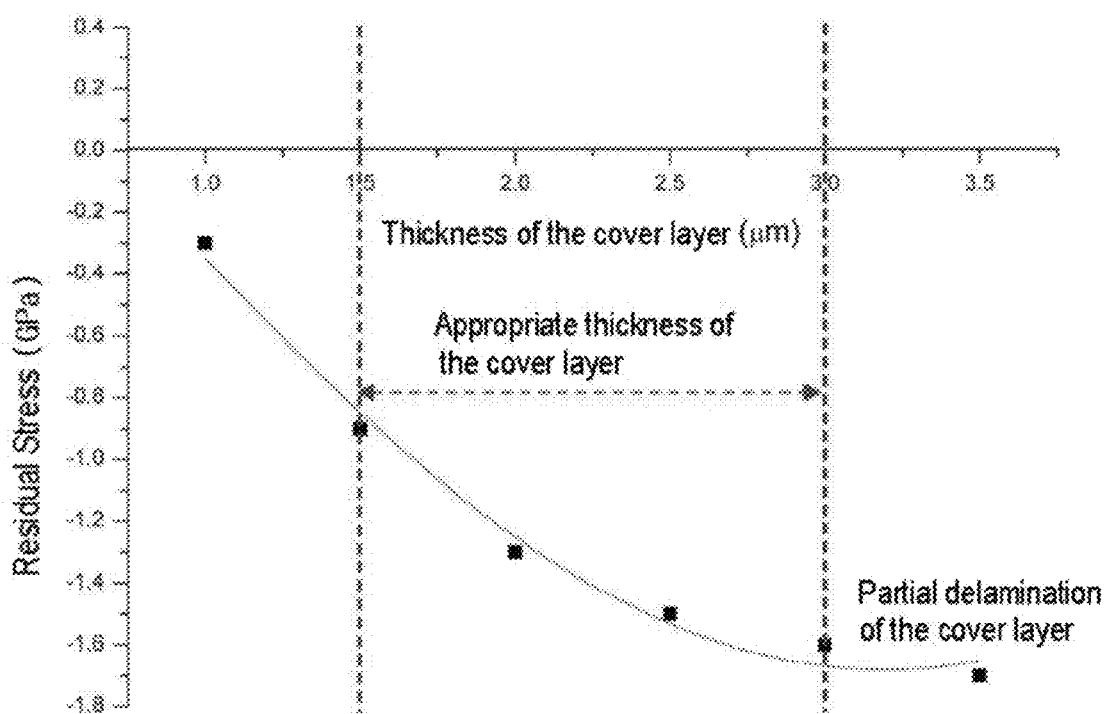
FIG. 7 is a graph showing changes in the surface residual stress of the coating layers according to a thickness of the cover layer.

FIG. 7 is a graph showing changes in the surface residual stress of the coating layers according to a thickness of the cover layer. As shown in FIG. 7, when the thickness was less than 1.5 μm, compressive residual stress of the coating layer was insufficient at less than 0.8 GPa, and when the thickness was greater than 3.0 μm, a partial delamination of the cover layer occurred. Therefore, preferably the thickness of the cover layer may be in a range of 1.5 μm to 3.0 μm.

The invention claimed is:

1. A coating layer for cutting tools formed on a surface of a parent material by using a chemical vapor deposition (CVD) method comprising:
    an alumina layer formed of an α-phase, disposed on the parent material and composed of a composite structure having a columnar crystal structure and an equiaxed crystal structure mixed therein; and
    a cover layer formed of $Al_xTi_ySi_zCr_wN$ (herein, x+y+z+w=1, x≥0.75, y≥0.2, 0≤z≤0.06, 0≤w≤0.08) and disposed on the alumina layer by a CVD method to be in a compressive stress state so that a residual stress of the alumina layer becomes compressive stress after coating the cover layer,
    wherein a thickness of the cover layer is in a range of 1.5 μm to 3.5 μm.

2. The coating layer for cutting tools formed on a surface of a parent material by using a CVD method of claim 1, wherein a bonding layer formed of $TiC_xO_yN_z$ (x+y+z=1, x,y,z>0, 0.4≤x≤0.5, 0.3≤y≤0.4, 0.15≤z≤0.25) is formed under the alumina layer by using a CVD method and the bonding layer is composed of a similar dendritic structure having a primary acicular structure grown in a thickness direction and a secondary acicular structure grown in an acicular shape on a surface of the primary acicular structure.

3. The coating layer for cutting tools formed on a surface of a parent material by using a CVD method of claim 1, wherein, among a texture coefficient (TC) of each crystal plane of the alumina layer calculated by the following Equation 1, TC(024) is 2.0 or more, TC(116) is less than 1.8, and TC(012), TC(104), TC(110), and TC(113) are all less than 1.3, $$TC(hkl)=I(hkl)/I_0(hkl)\times\{(1/n)\times\Sigma I(hkl)/I_0(hkl)\}^{-1}$$ [Equation 1]

I(hkl): diffraction intensity of a crystal plane
$I_0$(hkl): standard diffraction intensity of ASTM standard powder diffraction data
n: the number of crystal planes used for calculation
(hkl): (012), (104), (110), (113), (024), (116).

4. The coating layer for cutting tools formed on a surface of a parent material by using a CVD method of claim 1, wherein an upper portion of the alumina layer is doped with boron (B) at a content of 0.05 wt % or less.

\* \* \* \* \*